United States Patent [19]

Tarleton et al.

[11] Patent Number: 4,926,115

[45] Date of Patent: May 15, 1990

[54] UNIQUE PHASE DIFFERENCE MEASURING CIRCUIT

[75] Inventors: George K. Tarleton, Phoenix, Ariz.; Robert J. Abrant; Bruce A. Oltman, both of Downers Grove, Ill.

[73] Assignee: AG Communication Systems Corporation, Phoenix, Ariz.

[21] Appl. No.: 285,930

[22] Filed: Dec. 19, 1988

[51] Int. Cl.⁵ ............................................ G01R 25/00
[52] U.S. Cl. .................................. 324/83 D; 328/133; 307/514
[58] Field of Search .................. 328/133, 55; 307/514; 324/83 D

[56] References Cited

U.S. PATENT DOCUMENTS

| | | | |
|---|---|---|---|
| 3,521,172 | 7/1970 | Harmon | 328/133 |
| 3,600,690 | 8/1971 | White | 328/133 |
| 3,663,956 | 5/1972 | Purdy et al. | 324/83 D |
| 4,446,389 | 5/1984 | Williams et al. | 328/133 |
| 4,634,967 | 1/1987 | Virieux et al. | 324/83 D |

Primary Examiner—John S. Heyman
Attorney, Agent, or Firm—Anthony J. Baca

[57] ABSTRACT

A Unique Phase Difference Measuring Circuit which measures the phase difference between a reference pulse train and a slave pulse train. The present invention includes delay lines that determine the phase difference between the pulse trains which can be read directly by a microprocessor.

11 Claims, 3 Drawing Sheets

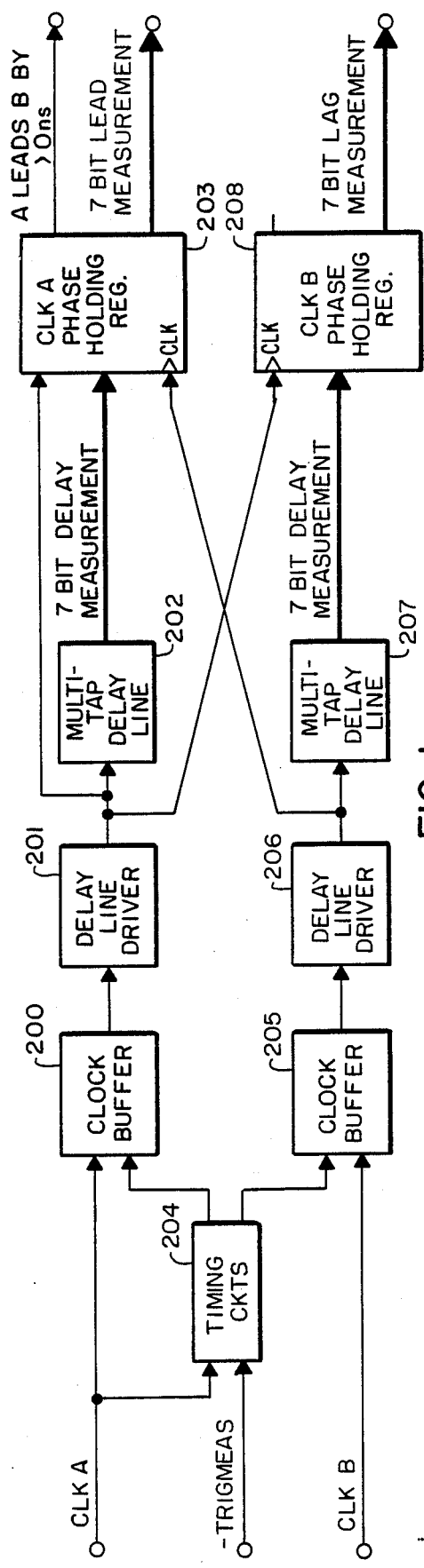
FIG. 1
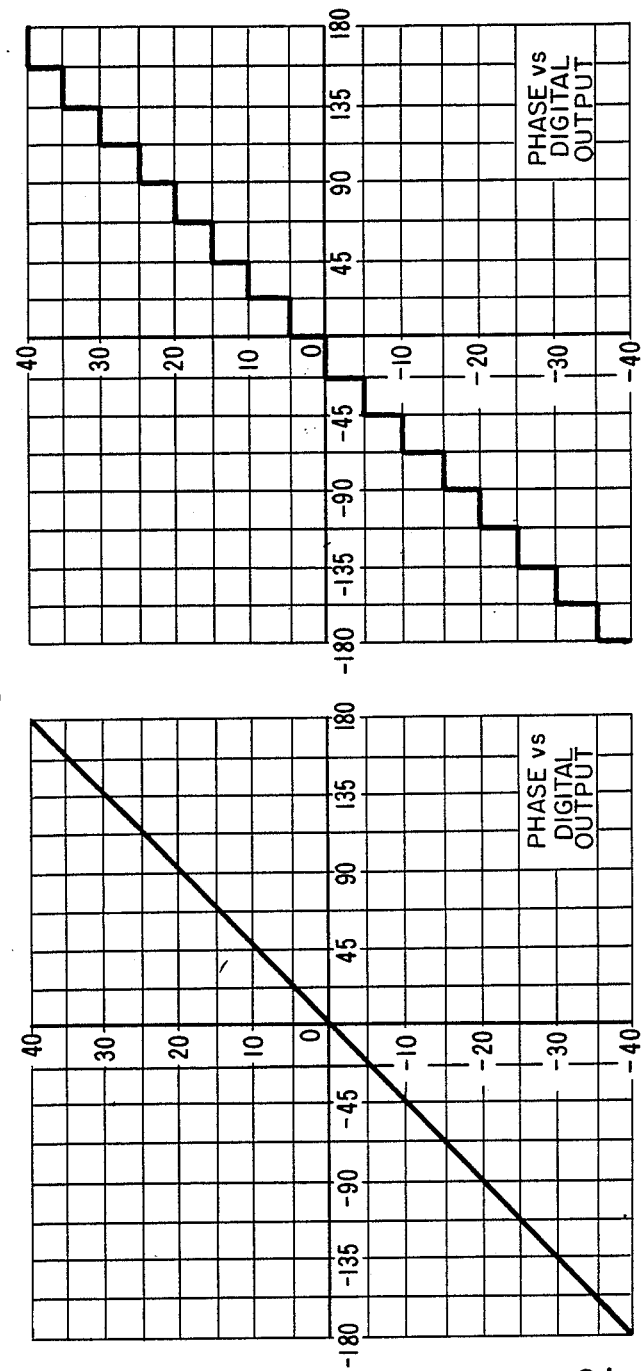
FIG. 3
FIG. 2

UNIQUE PHASE DIFFERENCE MEASURING CIRCUIT

BACKGROUND OF THE INVENTION

The present invention relates in general to digital clock generating systems and more particularly to the phase detector component of a digital phase locked loop (DPLL).

In modern digital telecommunication switching systems voice samples are transferred from central office to central office and within a central office as digital information. To preserve the integrity of this digital information and thus insure high quality voice communication, the telecommunication network is synchronized.

Therefore, it is a requirement for a central office telephone switching system to synchronize its local clock (slave) to that of the network (reference). Synchronization of the slave clock must be very precise and accurate as other offices may be synchronized to this central office's clock.

Synchronization between two clocks is best done by the use of a Phase Locked Loop (PLL). The concept of the PLL is well known and old in the art, but until recently the PLL function has been implemented predominantly by analog methods. With an analog phase locked loop the loop characteristics are fixed by analog components and cannot easily be changed.

A central office telephone switching system requires the PLL to have dynamic loop characteristics. Since a digital phase locked loop (DPLL) can have programmable loop characteristics, it has become the predominant PLL for such systems.

One critical element of a DPLL is the phase detector circuit which provides a numerical value proportional to the phase difference between the reference and slave signals. The phase detector circuits in prior art systems require either frequency count-down circuits or very high frequency clocks.

Frequency count-down circuits divide the fundamental frequency by an integer value and produce a phase difference value with an inherent error of plus or minus one. This error produces an uncertainty in the exact phase relationship of the slave to the reference. For most applications this type of phase detector works fine and does not cause any problems. However, central office telephone switching systems require that the clock which supplies timing pulses to the switching network, be phase locked to within a few degrees of a known reference.

Phase detectors employing very high frequency clocks may be employed to measure small phase differences at the fundamental frequency, but resolution of the phase detector is directly dependent on the clock frequency. A 100 MHz clock can resolve a 10 ns phase error, a 1 GHz clock can resolve a 1 ns error, . . . etc. Gating and counting circuits using such a fast clock are impractical and expensive for a central office telephone systems.

Accordingly, it is an objective of the present invention to provide a highly accurate phase detector circuit for determining the phase relationship of two signals in a DPLL.

SUMMARY OF THE INVENTION

In accomplishing the object of the present invention there is provided a phase difference measuring circuit for measuring the phase difference between a first pulse train and a second pulse train. The phase difference measuring circuit includes a timing circuit arranged to output timing signals in response to a received start phase measurement signal.

The circuit of the present invention further includes, a first and second clock buffer. The first clock buffer is connected to the first pulse train and to the timing signals. The first clock buffer passes the first pulse train in response to receiving the timing signals. A first delay line, connected to the output of the first clock buffer, is arranged to receive the first pulse train and to output signals representing a value of delay of the first pulse train.

The phase detector circuit of the present invention includes a first holding register, connected to the second clock buffer and to the first delay line, which latches the value of delay output by the first delay line when the second pulse train changes logic level. The first holding register then stores the last phase measurement with respect to the second pulse train.

The circuit of the present invention further includes, a second clock buffer connected to the second pulse train and to the timing signals. The second clock buffer passes the second pulse train in response to receiving the timing signals. A second delay line, connected to the output of the second clock buffer, is arranged to receive the second pulse train and to output signals representing a value of delay of the second pulse train.

The phase detector circuit of the present invention includes a second holding register, connected to the first clock buffer and to the second delay line, which latches the value of delay output by the second delay line when the first pulse train changes logic level. The second holding register then stores the last phase measurement with respect to the first pulse train.

BRIEF DESCRIPTION OF THE DRAWINGS

A better understanding of the invention may be had from the consideration of the following detailed description taken in conjunction with the accompanying drawings in which:

FIG. 1 is a block diagram of the phase detector circuit in accordance with the present invention.

FIG. 2 is a plot of the transfer characteristic of a linear phase detector.

FIG. 3 is a plot of the transfer characteristic of the digital phase detector circuit.

DESCRIPTION OF THE PREFERRED EMBODIMENT

Figure 4A:
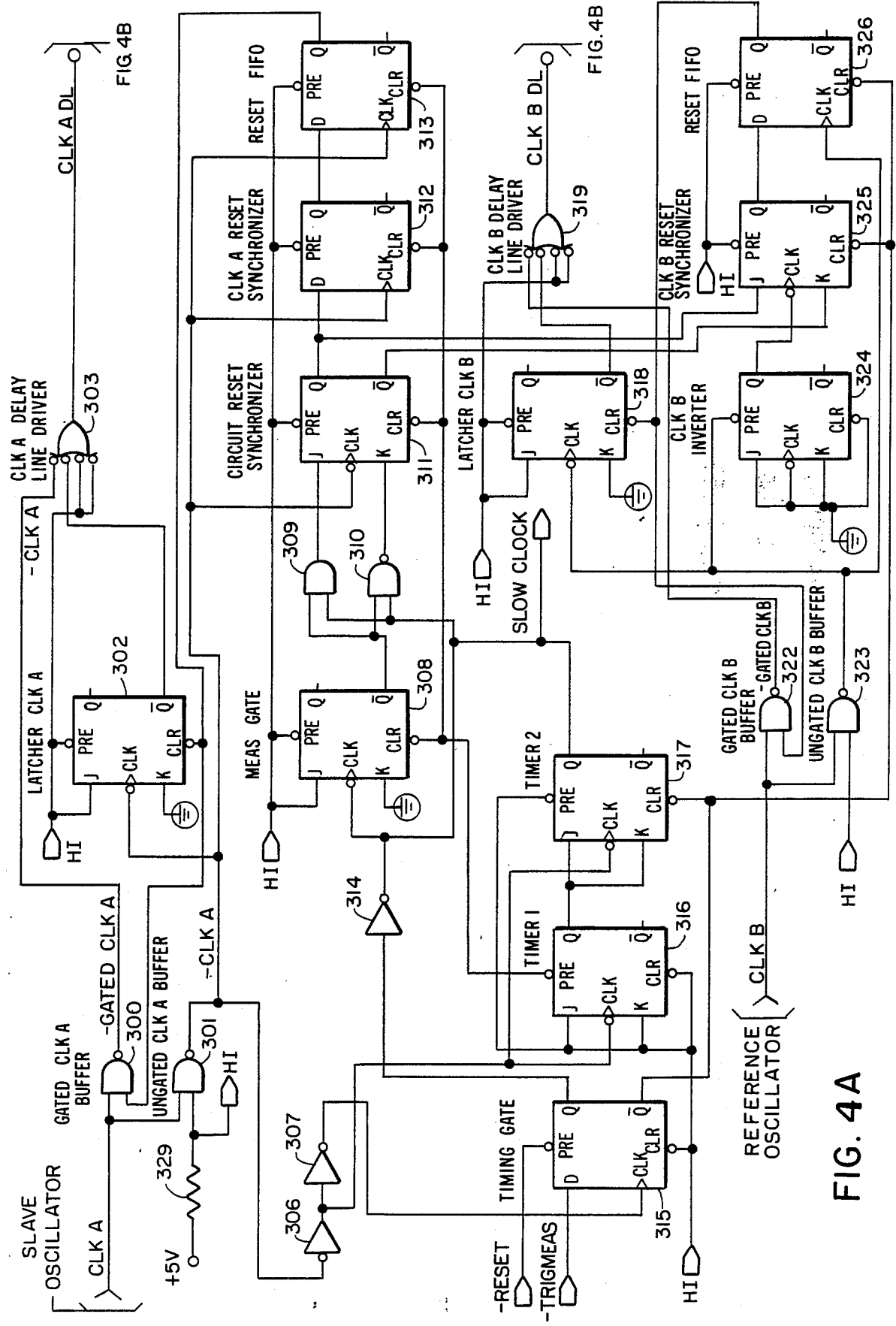
FIG. 4 is a schematic diagram of the phase detector circuit shown in FIG. 1 in accordance with the present invention.

Turning now to FIG. 1, a general description of the present invention will be given.

The present invention uses two precision multi-tap delay lines 202 and 207 to determine the phase difference between the two pulse trains. Each multi-tap delay line has ten taps with each tap located 5 ns down the delay line from the previous tap. This invention uses only the first seven taps of each delay line due to the pulse width of the pulse train that is being measured (40 ns). This circuit will work with other pulse widths and frequencies, however, the number of taps or the time between taps will have to be altered to match the frequency desired. Therefore, the invention approximates the ideal phase detector characteristic of FIG. 2, by quantizing the phase error in 5 ns steps as shown in FIG. 3. (At 12 MHz, 5 ns is about 22.5 degrees.)

The taps of the delay lines are connected directly to phase holding registers 203 and 208. The outputs of these registers represent locations within the delay lines that are spaced 5 ns in time and will contain the state of the corresponding tap of the delay line at the time that the phase holding register was clocked. The output of the CLKA delay line driver 201 is also wired directly to the input of the CLKA phase holding register 203. The corresponding output is called A LEADS B BY>0 NS and is used to determine the exact point where CLKA changes from leading to lagging CLKB.

Timing block 204 controls the starting and stopping of the phase measurement which is initiated when −TRIGMEAS (TRIGGER MEASUREMENT) is pulsed. The timing circuit 204 enables the clock buffers 200 and 205, which allow both CLKA and CLKB to be applied to the input of their respective delay line drivers 201 and 206.

Each delay line driver sends a positive going signal down its own delay line and at the same time clocks the other pulse train's phase holding register. Logic "1" (one or high) signals will be clocked into the phase holding register that correspond to the taps of the delay line that have been passed by the signal as it travels down the delay line. Logic "0" (zero or low) signals will be clocked into the phase holding register that correspond to the taps that the pulse has not yet reached.

When CLKA leads CLKB, or is exactly in phase with CLKB, a measurement will be clocked into the CLKA phase holding register 203 and all zeros will be clocked into the CLKB phase holding register 208. When CLKA lags CLKB a measurement will be clocked into the CLKB phase holding register 208 and all zeros will be clocked into the CLKA phase holding register 203. FIG. 3 shows that when CLKA lags CLKB by less that 5 ns, both phase holding registers will contain all zeros.

A microprocessor views each word sequentially i.e. from least significant bit to the most significant bit and the last bit to contain a "1" is the phase measurement. In this invention, when the two pulse trains are phase locked, the microprocessor will keep adjusting the slave clock so that signal A LEADS B BY>0 NS will alternate between "1" and "0". This will result in the tightest possible lock.

Figures 4A, 4B:
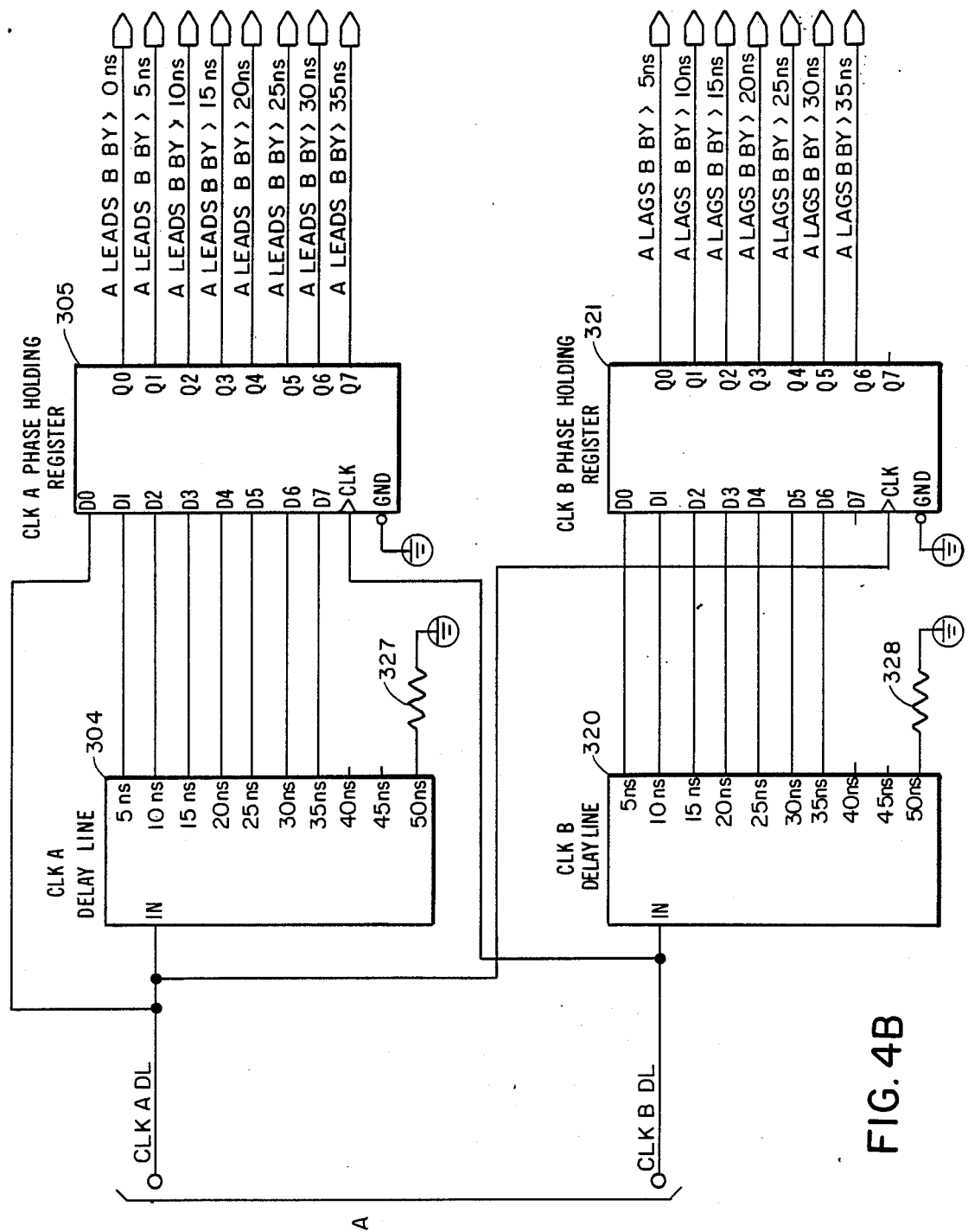

Turning now to FIG. 4, a detailed explanation of the circuit of the present invention will now be given.

Signal HI is a logic "1" signal which is used to pull unused gate inputs to the "1" state. Signal −RESET is used to reset the circuit after an initial power up. Signal CLKA is the slave pulse train, and signal CLKB is the reference pulse train. Signal −TRIGMEAS (TRIGGER MEASUREMENT) is pulsed to initiate a phase measurement. Signals A LEADS B BY>0 NS through A LEADS B BY>35 NS make up a digital word which will contain phase information if CLKA is leading CLKB. Signals A LAGS B BY>5 NS through A LAGS B BY>35 NS make up a digital word which will contain phase information if CLKA is lagging CLKB.

The slave signal to be measured (CLKA) is applied to NAND gate 300 (gated CLKA Buffer). Additionally the control signal from reset flip flop 313, which is used to control the measurement cycle, is connected to the second input of NAND gate 300. The output of this buffer is then connected to the CLKA delay line driver 303.

The ungated CLKA buffer 301 passes the slave signal (CLKA) to parts of the circuit that require a constant CLKA pulse train.

The reference signal to be measured (CLKB) is applied to NAND gate 322 (gated CLKB Buffer). Additionally the control signal from reset flip flop 326, which is used to control the measurement cycle, is connected to the second input of NAND gate 300. The output of this buffer is then connected to the CLKB delay line driver 319.

The ungated CLKB buffer 323 passes the reference signal (CLKB) to parts of the circuit that require a constant CLKB pulse train.

The JK flip flops 318 and 302 called latched CLKB and latched CLKA flip flops respectively, latch the occurrence of a measurement cycle and keep the delay line drivers 319 and 303 turned on, thereby, preventing a "0" going pulse to the delay lines on the falling edges of CLKB and CLKA respectively.

The CLKA delay line driver 303 is a 4-input NAND 50 ohm line driver which drives the multi-tap delay line 304. One input is connected directly to the gated CLKA buffer 300. Another input is connected directly to the −Q output of the latched CLKA flip flop 302. Its third and fourth inputs are connected to the signal HI.

The CLKB delay line driver 319 is similar to CLKA delay line driver 303 and is arranged to drive multi-tap delay line 320. One input is connected directly to the gated CLKB buffer 322. Another input is connected directly to the −Q output of the latched CLKB flip flop 318. Its third and forth inputs are connected to the signal HI.

Resistors 327 and 328 are connected to the 50 ns tap of each delay line 304 and 320 to terminate the delay line.

A D-type flip flop, timing gate 315, starts and stops the measurement cycle and is controlled via signal −TRIGMEAS.

Timer 1, 316 and Timer 2, 317 are JK flip flops which are used as count down timers to create the signal SLOW CLOCK. Signal SLOW CLOCK starts and then disables the measurement cycle after one measurement has been made.

The JK flip flop, 308, insures that only one phase measurement is made per measurement cycle. After a measurement is made, JK flip flop 308 is clocked by signal SLOW CLOCK and its −Q output will go to a "0". This will disable gates 309 and 310 and prevent any further measurements from being made until the JK flip flop 308 is cleared by the timing gate 315.

The circuit reset synchronizer flip flop 311 synchronizes the phase measurement to the CLKA pulse train. The CLKB reset synchronizer 325 synchronizes the CLKB side of the circuit to circuit reset synchronizer 311. This added synchronization stage is necessary because CLKB is not always synchronized with CLKA and setup and hold times of the reset flip flop 326 could be violated without this stage of synchronization.

The CLKA reset synchronizer 312, adds a timing delay equal to the delay of the CLKB reset synchronizer. The CLKA reset synchronizer 312 is required so that both the CLKA and CLKB measurements circuits have the same timing delays.

The CLKB inverter 324 is actually a JK flip flop with all of its inputs grounded except for the preset input (PRE). Since the clear (CLR) input of the JK flip flop is grounded the Q output of the JK flip flop will be a "0" when the preset (PRE) input is a "1". When the preset (PRE) input goes to a "0" the Q output of the JK flip flop will go to a "1". When preset (PRE) returns to a "1" the Q output will return to a "0". Therefore, the Q output is the inversion of signal −CLKB which is applied to the preset (PRE) input of the JK flip flop. This flip flop is used as an inverter in order to supply the correct polarity and to delay the clock pulse to the CLKB reset synchronizer 325 by approximately the same amount of time as the delay introduced by the circuit reset synchronizer 311.

Since the circuit reset synchronizer 311 and the CLKA reset synchronizer 312 are clocked by different edges of −CLKA, the signal on the D-input of the CLKA reset synchronizer 312 will always be stable when 312 is clocked.

First the circuit reset synchronizer 311 will be clocked by the falling edge of −CLKA and then the CLKA reset synchronizer 312 will be clocked on the next rising edge of −CLKA. If −CLKB and −CLKA are synchronized with little or no skew between them, a "1" will also be clocked into the Q output of the CLKB reset synchronizer 325 by −CLKB at the same time and both sides of the measurement circuit will start together.

However, if the CLKB inverter 324 was not used and the −CLKB was leading −CLKA by 30 to 40 ns a problem would result due to the propagation delay through the circuit reset synchronizer flip flop 311. Signal −CLKA would clock a "1" into the J input of the circuit reset synchronizer 311 but before the "1" could reach the Q output of 311, due to propagation delays, −CLKB which is leading −CLKA by 30 to 40 ns would clock the CLKB reset synchronizer 325. The JK inputs of 325 (which originate at the outputs of the circuit reset synchronizer 311) will not have yet changed due to the propagation delay through flip flop 311. The CLKB reset synchronizer 325 would miss its signal to change states and a faulty reading would be clocked into the phase holding registers (305 and 321). This situation is remedied by the CLKB inverter 324 which delays −CLKB by approximately the same time as the propagation delay through the circuit reset synchronizer 311.

The reset flip flop 313 applies and removes a reset signal to the CLKA measurement portion of the circuit. The reset signal controls the gated CLKA buffer 300 and the latched CLKA flip flop 302.

The reset flip flop 326 preforms a similar function to that of flip flop 313. The reset signal controls the gated CLKB buffer 322 and the latched CLKB flip flop 318.

The CLKA phase holding register 305 and the CLKB phase holding register 321 are octal D-type flip flops which will contain a phase measurement shortly after signal −TRIGMEAS is pulsed. A microprocessor can read the measurement.

With renewed reference to FIG. 4 a detailed description of the operation of the present invention will be given.

A phase measurement is initiated when −TRIGMEAS is pulsed low and a "0" is clocked into the timing gate 315 by the occurrence of a rising edge on signal −CLKA. The Q output of the timing gate goes low and is inverted by the inverter 314 which removes the clear signal from JK flip flop 308, circuit reset synchronizer 311, CLKA reset synchronizer 312, and reset flip flop 313. At the same time the −Q output of the timing gate 315 goes high and removes the clear signal from timer 317, CLKB reset synchronizer 325, and reset flip flop 326. The next rising edge of −CLKA clocks timer 316 and timer 317 which starts signal SLOW CLOCK (output of timer 317). SLOW CLOCK goes to a "1" at this time and enables NAND gate 310 and AND gate 309. This action causes a "1" to be applied to the J-input of the circuit reset synchronizer 311 and a "0" to be applied to 311's K-input.

The next falling edge of signal −CLKA will clock a "1" into the circuit reset synchronizer flip flop 311 which applies a "1" to the D-input of the CLKA reset synchronizer flip flop 312 and a "1" to the J-input of the CLKB reset synchronizer flip flop 324. The −Q output of the circuit reset synchronizer 311 also applies a "0" to the K-input of the CLKB reset synchronizer flip flop 325 at this time. The next occurrence of a rising edge on signal −CLKA will clock the CLKA reset synchronizer flip flop 312. The first occurrence of a rising edge on signal −CLKB to occur after the circuit reset synchronizer flip flop 311 was clocked will be inverted by the CLKB reset inverter 324 which in turn will clock the CLKB synchronizer flip flop 325. The next rising edge of −CLKA and −CLKB will clock the reset flip flop 313 and the reset flip flop 326 respectively. When the reset flip flop 313 is clocked its Q output will go to a "1" which removes the reset from the latched CLKA flip flop 302 and enables the gated CLKA gate 300. When the reset flip flop 326 is clocked by the next rising edge of −CLKB to occur after a "1" is clocked into the Q output of the CLKB reset synchronizer 325, 326's Q output will go to a "1" which removes the reset from the latched CLKB flip flop 318 and enables the gated CLKB buffer gate 322.

When CLKA goes high, the output of NAND gate 300 will go low causing the output of the CLKA delay line driver 303 to go high. This starts a pulse down the CLKA delay line 304. At the same time the output of the CLKA delay line driver 303 clocks a measurement into the CLKB phase holding register 321. CLKA is also passed through NAND gate 301 which clocks the latched CLKA flip flop 302 indicating that a measurement has taken place. Flip flop 302 also prevents a "0" from going down the delay line 304 when CLKA goes low. The phase holding registers 321 and 305 will then hold a phase measurement which can be read by a microprocessor.

Independent of CLKA, when CLKB at the input of gates 322 and 323 goes high, the output of NAND gate 322 will go low causing the output of the CLKB delay line driver 319 to go high. This starts a pulse down the CLKB delay line 320. At the same time, the output of the CLKB delay line driver 319 clocks a measurement into the CLKA phase holding register 305. CLKB also passes through the NAND gate 323 which clocks the latched CLKB flip flop 318 indicating that a measurement has taken place. Flip flop 318 also prevents a "0" from going down the delay line when CLKB goes low.

If CLKA leads CLKB, or is exactly in phase with CLKB, a measurement will be clocked into the CLKA phase holding register 305 and all zeros will be clocked into the CLKB phase holding register 321. If CLKA lags CLKB a measurement will be clocked into the CLKB phase holding register 321 and all zeros will be clocked into the CLKA phase holding register 305. When CLKA lags CLKB by less that 5 ns, phase holding registers 321 and 305 will both contain all zeros. The microprocessor can read the phase measurement directly from the phase holding registers 321 and 305.

The same —CLKA clock edge which clocks a "1" into the reset flip flop 313 and removes the reset from the CLKA side of the measurement circuit also clocks timer 317. This causes signal SLOW CLOCK (from timer 317) to go low and clock a "0" into the —Q output of the JK flip flop 308. This prevents another phase measurement from taking place by setting the stage for all zeros to be sequentially clocked into the circuit reset synchronizer 311, the CLKA reset synchronizer 312, the CLKB reset synchronizer 325, reset flip flop 313 and the reset flip flop 326 by subsequent —CLKA and —CLKB pulses.

When signal —TRIGMEAS returns to a "1", a "1" is clocked into the Q output of the timing gate 315 and is inverted by the inverter 314. At the same time the —Q output of the timing gate 315 goes low. The output of inverter 314 applies a clear signal to JK flip flop 308, circuit reset synchronizer 311, and reset flip flop 313. The —Q output of the timing gate 315 applies a clear signal to timer 317, CLKB reset synchronizer 325 and reset flip flop 326. The circuit is now cleared and ready to take another phase measurement.

It will be understood by those skilled in the art that: the two input NAND gates 300, 301, 322, and 323 should reside in the same IC pack to keep all gate propagation delays nearly equal. The two 4-input NAND 50 ohm delay line drivers 303 and 319, should reside in the same IC pack to keep gate propagation delays nearly equal. The two JK flip flops 311 and 325 should reside in the same IC pack to keep gate propagation delays nearly equal.

Although the preferred embodiment of the invention has been illustrated, and that form described, it will be readily apparent to those skilled in the art that various modifications may be made therein without departing from the spirit of the invention or from the scope of the appended claims.

What is claimed is:

1. A phase difference measuring circuit for measuring the phase difference between a first pulse train and a second pulse train, said phase difference measuring circuit comprising:

timing circuit means arranged to output timing signals in response to a received start phase measurement signal;

first and second clock buffer means, said first clock buffer means including a first input connected to said first pulse train, a second input connected to said timing signals and an output, and responsive to said first clock buffer means receiving said timing signal said first clock buffer means transmits said first pulse train from said output;

first delay line means for delaying said first pulse train, including an input connected to the output of said first clock buffer means, said first delay line means including a plurality of outputs, said outputs arranged to transmit signals representing a value of delay of said first pulse train;

first holding register means including a pulse train receiving input and a plurality of holding register inputs, said pulse train receiving input connected to said second clock buffer means output, and said plurality of holding register inputs connected to said plurality of outputs of said first delay line means, said holding register means arranged to latch the value of delay output by said first delay line means when said second pulse train changes logic level, and store the last delay measurement with respect to said second pulse train;

said second clock buffer means including a first input connected to said second pulse train, a second input connected to said timing signals and an output, and responsive to said second clock buffer means receiving said timing signal said second clock buffer means transmits said second pulse train from said output;

second delay line means for delaying said second pulse train, including an input connected to the output of said second clock buffer means, said second delay line means including a plurality of outputs, said outputs arranged to transmit signals representing a value of delay of said second pulse train, and;

second holding register means including a pulse train receiving input and a plurality of holding register inputs, said pulse train receiving input connected to said first clock buffer means output, and said plurality of holding register inputs connected to said plurality of outputs of said second delay line means, said holding register means arranged to latch the value of delay output by said second delay line means when said second pulse train changes logic level, and store the last delay measurement with respect to said first pulse train.

2. The phase difference measuring circuit as claimed in claim 1, wherein: said first clock buffer means comprises a NAND gate having an inverting output connected to said first delay line means, said NAND gate further including a first input connected to said first pulse train and a second input connected to said timing signals.

3. The phase difference measuring circuit as claimed in claim 1, wherein: said second clock buffer means comprises a NAND gate having an inverting output connected to said second delay line means, said NAND gate further including a first input connected to said second pulse train and a second input connected to said timing signals.

4. The phase difference measuring circuit as claimed in claim 1, wherein: said first delay line means comprises a delay line driver having an input connected to said first clock buffer output, said delay line driver including an output connected to the input of a multi-tap delay line, said multi-tap delay line having a plurality of outputs arranged to measure the value of delay of said multi-tap delay line input.

5. The phase difference measuring circuit as claimed in claim 1, wherein: said second delay line means comprises a delay line driver having an input connected to said second clock buffer output, said delay line driver including an output connected to the input of a multi-tap delay line, said multi-tap delay line having a plurality of outputs arranged to measure the value of delay of said multi-tap delay line input.

6. The phase difference measuring circuit as claimed in claim 1, wherein: said first holding register means comprises a plurality of Delay Flip-Flops (D-FF) having individual Delay (D) inputs connected to one of said plurality of outputs of said first delay means, said plurality of D-FFs further including a common clock input connected to the output of said second clock buffer means.

7. The phase difference measuring circuit as claimed in claim 1, wherein: said second holding register means comprises a plurality of Delay Flip-Flops (D-FF) having individual Delay (D) inputs connected to one of said plurality of outputs of said second delay means, said plurality of D-FFs further including a common clock input connected to the output of said first clock buffer means.

8. The phase difference measuring circuit as claimed in claim 4, wherein: said first holding register means comprises a plurality of Delay Flip-Flops (D-FF) having individual Delay (D) inputs connected to one of said plurality of outputs of said multi-tap delay line, said plurality of D-FFs further including a common clock input connected to the output of said second clock buffer means.

9. The phase difference measuring circuit as claimed in claim 5, wherein: said second holding register means comprises a plurality of Delay Flip-Flops (D-FF) having individual Delay (D) inputs connected to one of said plurality of outputs of said multi-tap delay line, said plurality of D-FFs further including a common clock input connected to the output of said first clock buffer means.

10. The phase difference measuring circuit as claimed in claim 1, wherein: said timing circuit means comprises a Delay Flip-Flop (D-FF) having the Delay (D) input connected to said start phase measurement signal, said Delay Flip-Flop including an output connected to synchronizing means, said synchronizing means arranged to generate said output timing signals simultaneously enabling both said first clock buffer means and said second clock buffer means.

11. A phase difference measuring circuit for measuring the phase difference between a first pulse train and a second pulse train, said phase difference measuring circuit comprising:

timing circuit means arranged to output timing signals in response to a received start phase measurement signal;

first and second clock buffer means, said first clock buffer means connected to said first pulse train and to said timing signals, and responsive to said timing signals said first clock buffer means transmits said first pulse train;

first delay line means connected to said first clock buffer means, said first delay line means arranged to transmit signals representing a value of delay of said first pulse train;

first holding register means connected to said second clock buffer means and to said first delay line means, said holding register means arranged to latch the value of delay output by said first delay line means when said second pulse train changes logic level, and store the last delay measurement with respect to said second pulse train;

said second clock buffer means connected to said second pulse train and to said timing signals, and responsive to said timing signals said second clock buffer means transmits said second pulse train;

second delay line means connected to said second clock buffer means, said second delay line means arranged to transmit signals representing a value of delay of said second pulse train, and;

second holding register means connected to said first clock buffer means and to said second delay line means, said holding register means arranged to latch the value of delay output by said second delay line means when said second pulse train changes logic level, and store the last delay measurement with respect to said first pulse train.

* * * * *